United States Patent [19]

Misiano et al.

[11] Patent Number: 5,466,296
[45] Date of Patent: Nov. 14, 1995

[54] THIN FILM DEPOSITION APPARATUS, MAINLY DEDICATED TO PECVD AND SPUTTERING TECHNIQUES AND RESPECTIVE PROCESSES

[75] Inventors: Carlo Misiano; Enrico Simonetti, both of Rome; Giovanni Taglioni, Tivoli, all of Italy

[73] Assignee: CE.TE.V Centro Technologie Del Vuoto, Carsoli, Italy

[21] Appl. No.: 222,690

[22] Filed: Apr. 4, 1994

[30] Foreign Application Priority Data

Apr. 6, 1993 [IT] Italy ............... RM93A0216

[51] Int. Cl.6 .................................. C23C 16/00
[52] U.S. Cl. .............. 118/723 MP; 204/298.26; 118/719; 118/730; 118/723 E
[58] Field of Search ............... 118/730, 719, 118/723 MA, 723 MP, 723 E; 156/345; 204/298.11, 298.19, 298.26, 298.28

[56] References Cited

FOREIGN PATENT DOCUMENTS

| 0409451 | 1/1991 | European Pat. Off. |
| 2034356 | 6/1980 | United Kingdom . |
| WO9206224 | 4/1992 | WIPO . |

OTHER PUBLICATIONS

Japan Abstracts JP-A 63 095 983 (Mitsubishi Chem Ind. Ltd).
Japan Abstracts JP-55 145 172 (Hitachi Ltd.).
"European Search Report" (ITARM930216), 3 pages.
Patent Abstracts of Japan, JP63095983, 1 page.

*Primary Examiner*—R. Bruce Breneman
*Assistant Examiner*—Joni Y. Chang
*Attorney, Agent, or Firm*—Herbert Dubno

[57] ABSTRACT

Thin film deposition apparatus, utilizing PECVD, sputtering technologies, etc., essentially constituted by a chamber equipped with one or more electrodes and respective counter-electrodes, screens, gas supply lines, and one or more magnetron sputtering cathode. The chamber is provided with a rotating device loading substrates able to rotate through 180 degrees objects to treat. The chamber can have polygonal geometry, provided to consent installation of one or more kinds of sources. The invention consents, in a single vacuum cycle the deposition of hardening and anti-reflecting layers on plastic material and it does not need frequent recharges.

2 Claims, 3 Drawing Sheets

THIN FILM DEPOSITION APPARATUS, MAINLY DEDICATED TO PECVD AND SPUTTERING TECHNIQUES AND RESPECTIVE PROCESSES

FIELD OF THE INVENTION

The invention relates to a thin film deposition apparatus intended primarily for the ophthalmic field, particularly for plastic material substrates. The apparatus makes it possible to effect more than one treatment, that is the application of many thin films for the ophthalmic field, particularly for plastic material substrates. The apparatus makes it possible to effect more than one treatment, that is the application of many thin films in a single vacuum cycle. It also allows, for example the deposition of a hardening layer on plastic material together with optical interference treatments, e.g. antireflecting treatments.

Depositions on both substrate sides are provided by this new technique in accordance with the sequential process steps:

layer hardening treatment;

optical treatment;

water-repellent and anti-dirt treatments of the antireflecting layer which can use a PECVD process.

The invention is applicable above all in the ophthalmic sector, for instance in lens treatment, laser instruments and so on, for optical automotive equipment and wherever PECVD techniques are involved.

In addition, the invention can be utilized for the manufacture of electronic components, semiconductors, microcircuits and the like, to be applied in civilian and military areas.

OBJECT OF THE INVENTION

It is the principal object of the present invention to improve these techniques, to reduce costs and improve workmanship are reduced so that coatings are easier to make.

BACKGROUND OF THE INVENTION

Until now to realize a process of the type described it was necessary to perform a number of operations, partially automatic, in which lenses were reloaded or substrates mounted on many and different machines, and then cleaning processes, were effected, resins were applied, drying was carried out, and so on.

All these operations required, additionally, the use of aspirant hoods. In fact the operator was exposed to solvents and resin vapors which are noxious, as known.

Recently there has been a trend to make optical components from plastic materials, for example CR39, known to the worker skilled in the art, ophthalmic articles. In addition optical components of plastic material have spread throughout commercial and scientific sectors.

However optical components in plastic material have hitherto involved not negligible drawbacks including:

Insufficient surface hardness, which makes the substrate surface vulnerable to abrasion with subsequent interference with transparency.

Sensitivity to heat which strongly decreases the ability to use the process for optical and thin film coatings.

An expansion coefficient which is greater than that of inorganic materials usually employed to effect optical and thin film coating.

Currently, some of these drawbacks are partially resolved by lacquer and immersion processes, for hardening the substrate surface, and by making thin film deposition almost cold by integrating traditional thermic evaporation with ionic bombardment.

These processes, however, often produced coatings which rapidly deteriorated, and/or with adverse environmental effects.

Hardening processes which are more innovative can be found in the market, based on the PECVD technique, for instance the process utilized at Balzers (Lichtenstein) and in antireflex coating of the plasma assisted type.

For example in processes realized by Laybold, and OCLI (U.S.A), the technique of magnetron sputtering, ionic gun assisted, has been adopted with what we believe are unsatisfactory results.

It is our opinion that the closest prior art is that described in European Patent No. 0 502 385A dated 22.2.92 filed by Balzers, Inventor Zimmermann. In this system thin film optical interference deposition is realized by evaporation from a thermal source, with all of the limitations described above.

With this method, that is with not very thick films as in the description, the drawbacks are: insufficient hardness, insufficient durability, insufficient adherence.

SUMMARY OF THE INVENTION

These objects and others which will become apparent hereinafter are attained in accordance with the invention in an apparatus:

a polygonal coating chamber having a multiplicity of vertical walls, and a cover;

a substrate carrier mounted on the cover and provided with a drive for rotating the substrate carrier in the chamber;

at least one substrate rotating device on the carrier positionable by the drive at each of the vertical walls in succession, the substrate rotating device being constructed to receive a respective substrate and to rotate the respective substrate through 180° about a vertical axis of the device;

PECVD electrodes and PECVD counter electrodes at at least some of the walls for PECVD coating of a substrate on one side and on an opposite side in successive operations upon rotation of a substrate about the axis of the device;

at least one magnetron at a respective another of the walls for treating the substrates as the substrates are positioned at the other wall;

means for evacuating the chamber;

means for admitting gas to the chamber; and screens at some of the walls for shielding the substrates.

The device can be so rotatable that it can keep the substrates in the same position during different depositions.

The apparatus can be used in a process involving the following steps:

a. cleaning the substrate preferably with isopropyl alcohol and then blowing it dry with nitrogen;

b. introducing the substrates into the chamber;

c. evacuating the chamber;

d. effecting a discharge for a period of minutes;

e. introducing a gas, preferably an organosilane;

f. maintaining the discharge until the desired thickness of deposit is obtained;

g. injecting oxygen during the discharge to harden the deposit, the oxygen being injected with ever increasing concentration so that the layer passes continuously from organic to inorganic thereby making the structure elastic and strong;

h. closing the vacuum line for the PECVD process and opening the valve for high vacuum pumping;

i. introducing a process gas, for example argon and oxygen;

j. effecting a power discharge with an RF generator for stabilization;

k. depositing high refractive index material;

l. depositing low refractive index material;

m. repeating steps (k) and (l) until the desired reflecting layers are formed;

n. rotating the substrate by the rotating device after closing off the high vacuum valve and the process gas inlet;

o. starting the deposition cycle again to coat the opposite side of the substrate.

The invention is particularly advantageous for producing ophthalmic lenses and the system as described can be used with a computerized control system.

From the foregoing it is easy to ascertain that the vacuum apparatus configuration is certainly traditional and of insufficient industrial applicability, if compared with the present invention.

This invention then, resolves all the aforesaid drawbacks, as the requested coating operations are effected in the vacuum and in only one cycle, and the hardening process and the thin film optical deposition process on both of the surfaces, are effected by rotating the components.

It is important to underline that with this new process the operator is not exposed to solvents and resins vapor. Consequently it is not necessary to equip the apparatus with aspirant hoods.

This is certainly important as it involves the operator health, and so represents another advantage over the techniques utilized till now.

All these advantages make the process much less expensive than the earlier solutions.

The present invention combines in a single apparatus the PECVD technique to realize hardening and surfacing of the substrate and reactive magnetron sputtering to obtain the antireflecting coating. In conclusion, to effect in a single process both hardness and antireflecting treatments on both sides, is the most important aspect of the invention. Obviously, all the operations presented in the process can be automated with a suitable control software system applied to the apparatus.

It is evident that the possibility to effect a series of coatings in a single time, and on both the surfaces, represents a reduction of cost and time, which approximately could be quantified in 50 percent, relative to prior art techniques. In addition, for the process of the invention a frequent recharge of deposition sources is not necessary because in one case the material is supplied with the flow atmosphere (PECVD). In the other case (sputtering) the material constituting the cathode lasts for hundreds of processes. The process of the invention, is therefore suitable as more highly productive system than the hitherto known technologies.

By contrast with a known system which can treat only one substrate at a time, the apparatus of the invention can contemporaneously make a multiplicity of contemporary coatings.

The characteristics of the films obtained by sputtering, relatively to the adherence, resistance to abrasives, hardness and resistance to the environmental agents are decidedly better than those obtainable through thermal evaporation, even ion assisted evaporation, because of the greater energy of deposited particles.

BRIEF DESCRIPTION OF THE DRAWING

The above and other objects, features, and advantages of the present invention will become more readily apparent from the following description, reference being made to the accompanying drawing in which.

SPECIFIC DESCRIPTION

Figure 1:
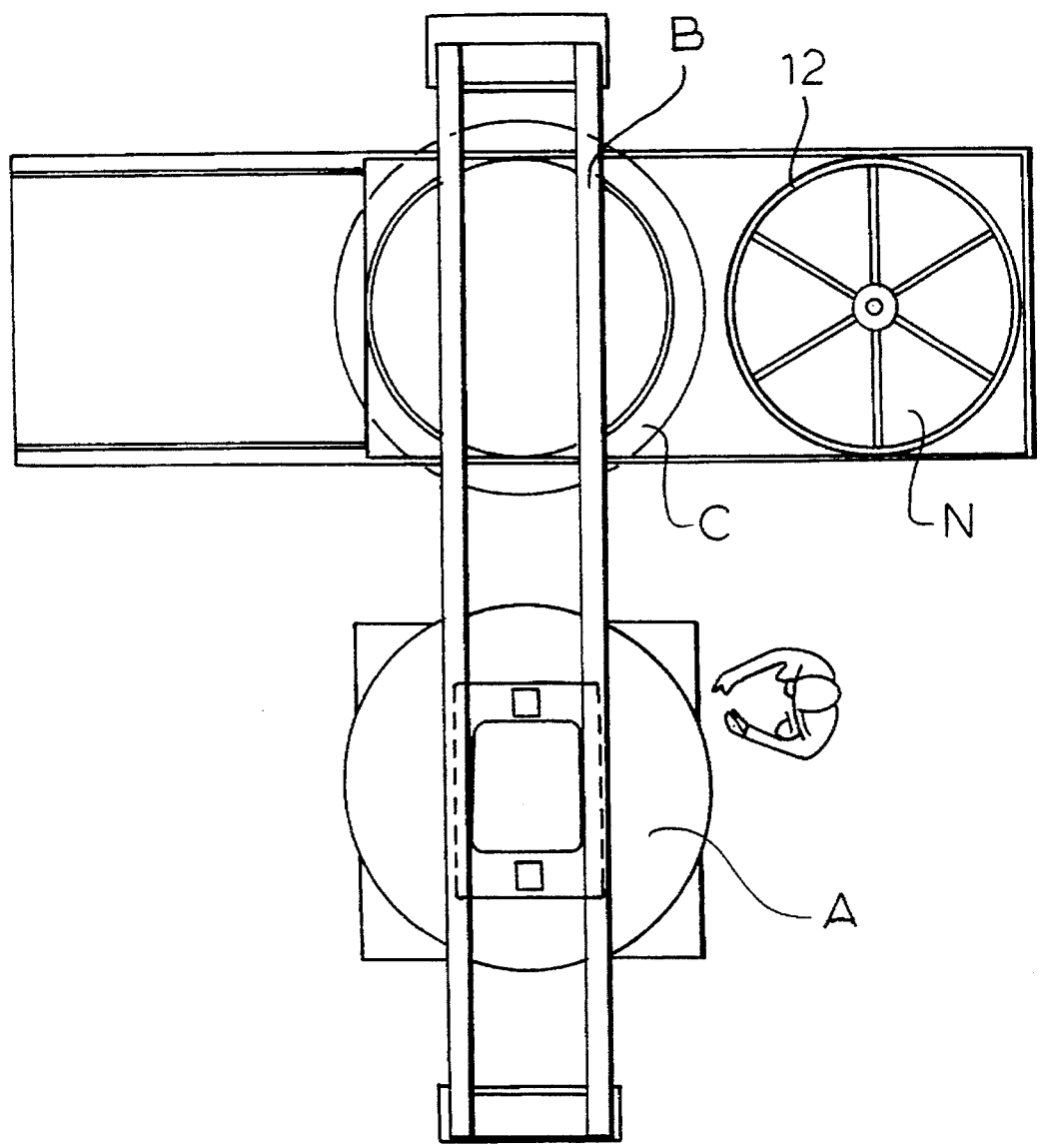
FIG. 1 is plan view of the apparatus of the invention.
Figure 2:
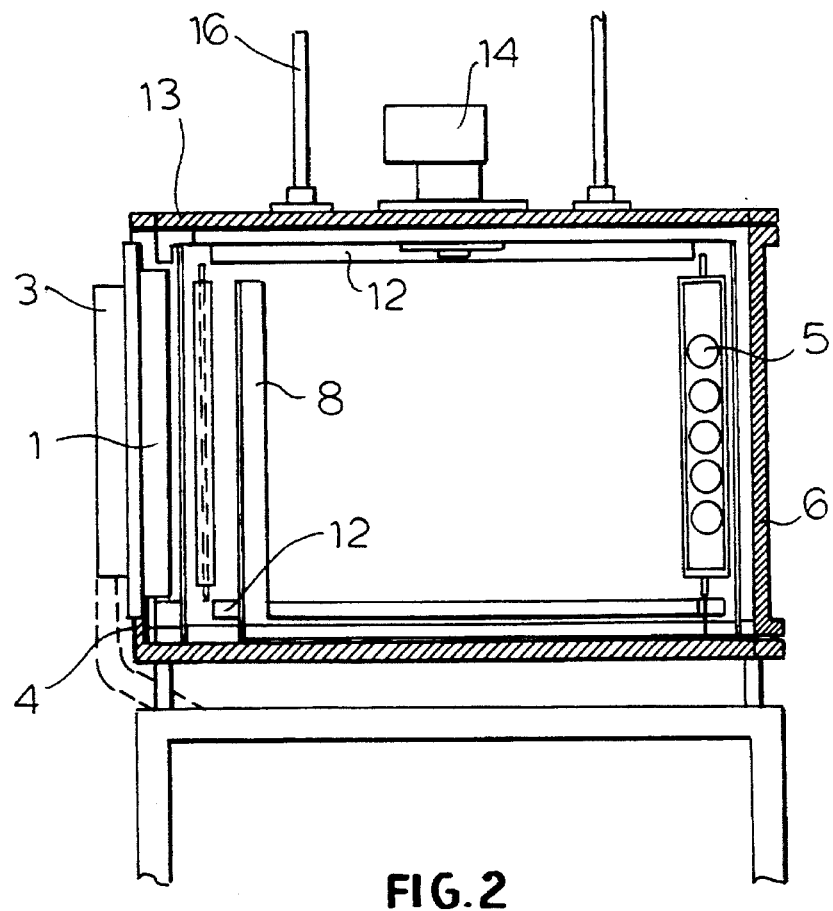
FIG. 2 is a vertical cross sectional view through the coating chamber.
Figure 4:
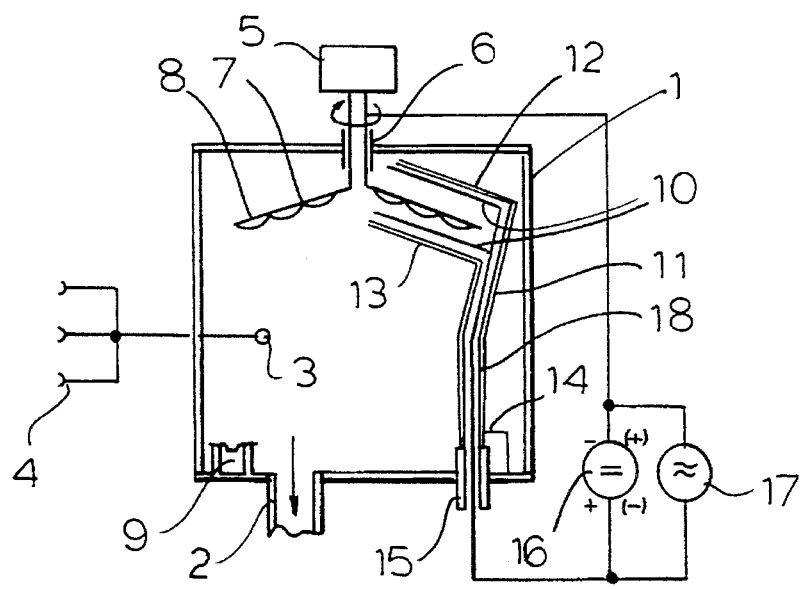
FIG. 4 is a cross sectional view through the deposition chamber of the European patent, illustrated for comparison with the present invention.
Figure 3:
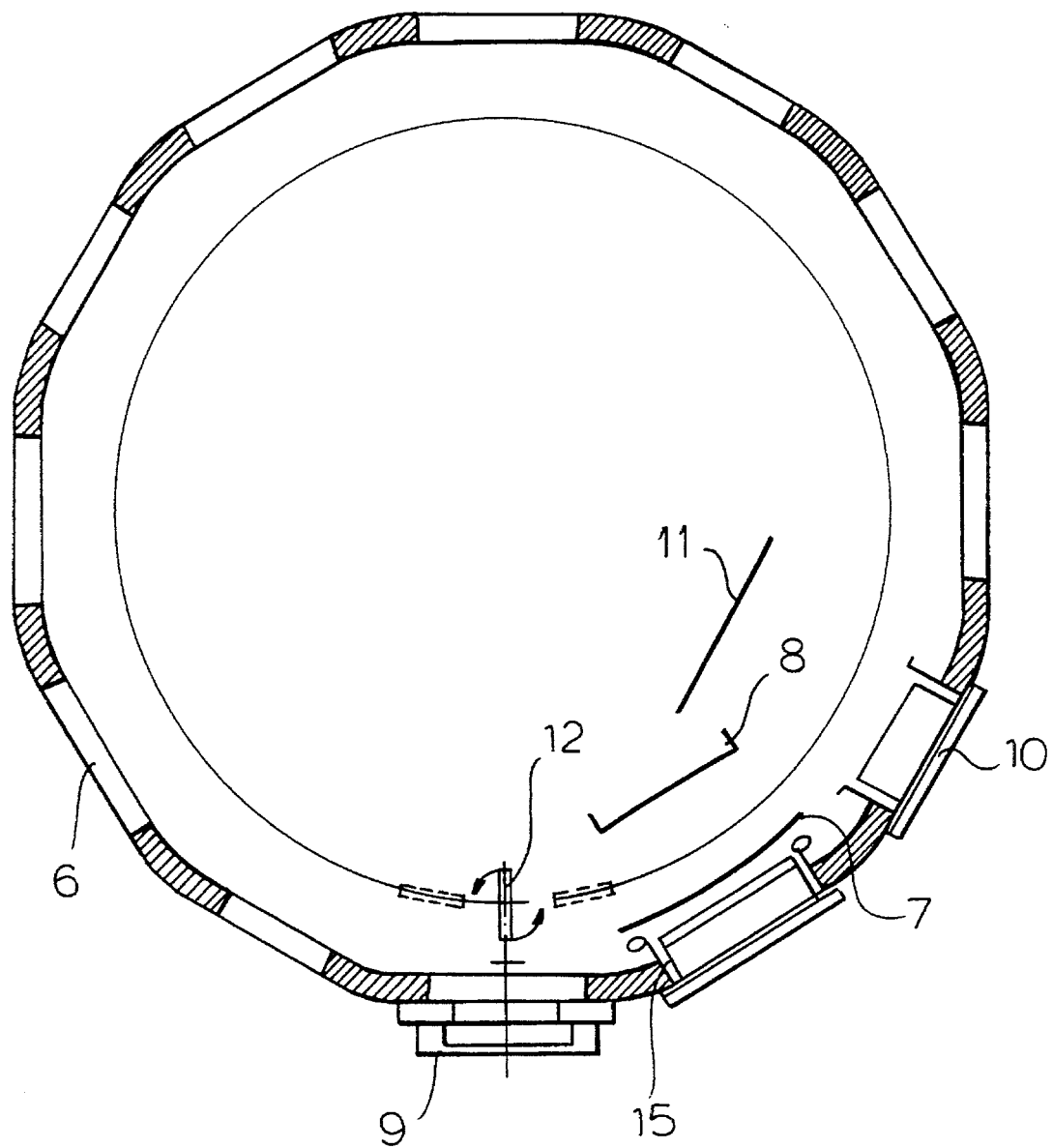
FIG. 3 is a horizontal cross section through the chamber.

FIG. 4 shows the prior art chamber mentioned previously which can deposit thin film optical interference coatings by evaporation from a thermal source As can be seen from FIG. 1, the deposition apparatus A (FIGS. 2 and 3) can be provided with a cover lifting system B for a cover 13 carrying the rotating member 12 which is accessible at N and carries the rotating or turning devices, one of which can be seen at 12 in FIG. 3.

In the cross sectional view of FIG. 2, the chamber is seen to be provided with electrodes 1 which can be connected to the network 3, the chamber having an axis door 4 to allow access to the sources and for maintenance. Each rotating device has a substrate carrying panel 5, two of which can be seen in FIG. 2 at right angles to one another. FIG. 2 also shows the counterelectrodes 8 and, in cross section, the apparatus cover 13 from which the rotating devices 12 depend, the rotating devices revolving on the cover as driven by a drive 14 effecting the substrate rotation. The cover supports are represented at 16.

Turning to FIG. 3 it can be seen that the chamber 6 is polygonal and has at some of the vertical walls, PECVD screen electrodes 7 and counterelectrodes 8, PECVD electrodes 9, sputtering magnetron cathodes 10, screens 11 and, of course, the rotating device 12 only one of which is shown in FIG. 3. The process gas supply line is represented at 15.

The apparatus configuration, is one of the most significant aspects of the invention. It can be realized in many ways, by any configuration.

We prefer a polygonal configuration so that the substrates can be installed in front of many sources which can be disposed on any side of the chamber, in continuous movement. It can be equipped with cathodes 10, screens 7, electrodes 8, 9, etc.

FIG. 3 is to be considered the most important.

The apparatus, essentially (FIG. 3), is constituted by a chamber 6, one (or more) rotating devices 12 carrying substrates, able to turn over or around the carrying substrates; by PECVD electrodes 9, PECVD counter-electrodes 8, and screens 7 for the source isolation.

The hardening process, which is one of the processes which can be carried out, is described below:

a) cleaning of the substrate, preferably by isopropyl alcohol, blowing nitrogen over the substrate to dry it;

b) introducing substrates into the chamber;

c) evacuating the chamber by a vacuum pumping device (for a PECVD process);

d) initiating a discharge for some minutes;

e) introducing a gas, preferably organosilane through an aperture opening into the chamber (6);

f) maintaining the discharge until the desired thickness of deposit is attained;

g) inserting $O_2$ during the discharge, to obtain the hardening. The $O_2$ is introduced by a line provided with a flow meter with progressively increasing concentration, so as to transform the coating in a continuous manner, from an organic layer to an inorganic layer as well as to make the structure elastic and resistant;

h) closing the suction line in the chamber for the PECVD process and opening the valve which connects the high vacuum pumping unit with said chamber;

i) introducing process gas, for instance Argon+$O_2$, into the chamber 6;

j) feeding the power discharge by a RF generator stabilizing process parameters;

k) depositing high refractive index material;

l) depositing low refractive index material;

m) repeating n) and m) until the reflecting layer is correctly effected;

n) rotating substrates by the rotating device after closing the high vacuum valve and then inlet process gas;

o) restarting again with a new deposition cycle from point a).

The deposition plant and respective processes, for which a patent is requested, are applicable with success in any industry producing compatible products for its characteristics of quickness in obtaining coatings, for saving workmanship for the excellent conditions in which operators work. For the best quality of the product, the apparatus can be utilized anywhere PECVD and PVD, sputtering, and like processes are requested.

We claim:

1. An apparatus for applying thin films to substrates, comprising:

a polygonal coating chamber having a multiplicity of vertical walls, and a cover;

a substrate carrier mounted on said cover and provided with a drive for rotating said substrate carrier in said chamber;

at least one substrate rotating device on said substrate carrier positionable by said drive at each of said vertical walls in succession, said substrate rotating device being constructed to receive a respective substrate and to rotate the respective substrate through 180° about a vertical axis of said substrate rotating device;

PECVD electrodes and PECVD counter electrodes at at least some of said walls for PECVD coating of a substrate on one side and on an opposite side in successive operations upon rotation of a substrate about the axis of the device;

at least one magnetron at a respective another of said walls for treating said substrates as said substrates are positioned at said other wall;

means for evacuating said chamber;

means for admitting gas to said chamber; and screens at some of said walls for shielding said substrates.

2. The apparatus defined in claim 1 wherein said substrate rotating device is constructed and arranged to rotate to maintain substrates thereon in the same position during rotation past said walls.

* * * * *